United States Patent [19]

Lin

[11] Patent Number: 5,882,957
[45] Date of Patent: Mar. 16, 1999

[54] BALL GRID ARRAY PACKAGING METHOD FOR AN INTEGRATED CIRCUIT AND STRUCTURE REALIZED BY THE METHOD

[75] Inventor: Ting-hao Lin, Taoyuan Hsien, Taiwan

[73] Assignee: Compeq Manufacturing Company Limited, Taoyuan Hsien, Taiwan

[21] Appl. No.: 871,471

[22] Filed: Jun. 9, 1997

[51] Int. Cl.[6] ............................ H01L 21/44; H01L 21/48; H01L 21/50

[52] U.S. Cl. .......................................... 438/126; 438/613

[58] Field of Search ..................................... 257/738, 778, 257/780, 787; 361/760; 174/260, 261; 228/180.22; 438/126, 106, 118, 120, 121, 122, 124, 612–617

[56] References Cited

U.S. PATENT DOCUMENTS 5,397,917   3/1995   Ommen et al. ........................... 257/698
5,663,593   9/1997   Mostafazadeh et al. ................ 257/666

*Primary Examiner*—Brian Dutton
*Attorney, Agent, or Firm*—Oppenheimer Wolff & Donnelly LLP

[57] ABSTRACT

A BGA packaging method for an IC includes steps of providing a first dry film to a copper plate, plating nickel-copper to form circuits on one side of the copper plate, providing a second dry film, selectively plating nickel-gold, removing the dry films, providing an insulating layer, providing a back plate, attaching a chip, wire bonding, encapsulating the chip and wires with plastic, etching copper, providing solder resist and attaching solder balls. By this method, a packaged IC with excellent electrical characteristics and heat dissipation can be obtained through a simple procedure.

9 Claims, 4 Drawing Sheets

BALL GRID ARRAY PACKAGING METHOD FOR AN INTEGRATED CIRCUIT AND STRUCTURE REALIZED BY THE METHOD

BACKGROUND OF THE INVENTION

1. Field of the Invention

The present invention relates to a ball grid array (BGA) packaging method for an integrated circuit (IC), more particularly, to an improved BGA packaging method, by which a packaged IC having excellent heat dissipation, a small thickness, and high reliability is provided with a simple process.

2. Description of Related Art

FIGS. 2A to 2H show respective steps of a conventional BGA packaging method. Firstly, as shown in FIG. 2A, a double-side printed circuit board (PCB), which is a substrate plate 70 having both sides thereof respectively laminated with copper foils 71, is cut and drilled to defined through-holes 711. Then in FIG. 2B, inner walls of the through-holes are plated with copper 712.

Then, as shown in FIG. 2C, dry films 721 are respectively provided to the two opposite sides of the circuit board to form patterns of circuits on the two opposite sides.

Subsequentially, referring to FIG. 2D, proper positions of the circuit board are provided with solder resist 72, the holes at the proper positions are also filled with the solder resist 72. The exposed portions, which are not covered by the solder resist 72 are plated with gold.

As shown in FIG. 2E, the through-holes 711 in the central position of the circuit board are filled with conductive paste 73, and a chip 74 is attached thereto. The conductive paste 73 filled into the through-holes 711 conducts the copper foils 71 on the two opposite sides for the purpose of heat dissipation.

The next step is wire bonding. Referring to FIG. 2F, fine gold wires 75 are connected between the chip 74 and the circuit on the PCB.

Then the chip 74 and the wires 75 are encapsulated by plastic 76, as shown in FIG. 2G. Such operation needs a mold and the plastic is injected into the mold to form a shield for protecting the chip 74 and wires 75.

Finally, solder balls 77 are attached to proper positions of the circuit board, as shown in FIG. 2H.

However, the conventional BGA packaging method has some drawbacks:

1. Such method utilizes the double-side circuit board, so the step of drilling through-holes is necessary, and the operation of filling the through-holes with solder resist or conductive paste may be unreliable.
2. The heat generated by the chip must be dissipated via the conductive paste, thus the effect of heat dissipation is insufficient. If a defect occurs in the conductive paste filled into the through-holes, the heat dissipation will be even more degraded.
3. It is necessary to fabricate a mold for the step of providing plastic to encapsulate the chip.
4. The thickness of the packaged product is considerable.
5. The capability of plastic to transfer heat is poor, so gold wires bonded on board side are easily slipped off, causing a problem of poor connection.
6. It is not possible to add a ground layer to the packaged IC, therefore the electrical characteristics of the package are not satisfactory.
7. It is not possible to form dense circuits on the circuit board of the IC since there are a plurality of through-holes therein.

Accordingly, the present invention is provided to solve the above problems.

SUMMARY OF THE INVENTION

One object of the present invention is to provide an improved BGA packaging method, by which an IC is well packaged without drilling through-holes and filling the holes with conductive paste.

Another object of the present invention is to provide an improved EGA packaging method, by which dense circuits in the IC with higher reliability and finer wires than prior art can be obtained.

Still another object of the present invention is to provide an improved BGA packaging method, by which excellent heat dissipation of the IC is obtained.

A further object of the present invention is to provide an improved BGA packaging method, by which great electrical characteristics of package are attained.

Still a further object of the present invention is to provide an improved BGA packaging method, by which an IC is packaged without fabricating a mold for injecting plastic to encapsulate a chip and fine gold wires of the IC.

Still a further object of the present invention is to provide an improved BGA packaging method, by which a packaged IC with a very small thickness is obtained.

In accordance with one aspect of the present invention, the BGA packaging method comprises steps of providing a first dry film to a copper plate, plating nickel-copper to form circuits on one side of the copper plate, providing a second dry film, selectively plating nickel-gold, removing the dry films, providing an insulating layer, providing a back plate, attaching a chip, wire bonding, encapsulating the chip and wires with plastic, etching the copper plate, providing solder resist and attaching solder balls.

In accordance with another aspect of the present invention, the IC packaged by the present method has circuits formed on only one side of the copper plate, thereby eliminating the need for and thus the associated problems of the through-holes.

In accordance with a further aspect of the present invention, the chip is directly provided on metal, so that heat generated from the chip can be dissipated readily.

In accordance with a further aspect of the present invention, the back plate can be made of metal to serve as a ground layer, or a ground layer can be added under the back metal, therefore, the electrical characteristics of the IC can be improved.

In accordance with still a further aspect of the present invention, the IC packaged by the present method has a metal plate formed as a base, so the plastic for protecting the chip and gold wires can be provided directly thereto, without fabricating an additional mold. Therefore, the process cost on tool can be minimized.

Other objects, advantages and novel features of the invention will become more apparent from the following detailed description when taken in conjunction with the accompanying drawings.

DETAILED DESCRIPTION OF PREFERRED EMBODIMENT

Figure 1A:
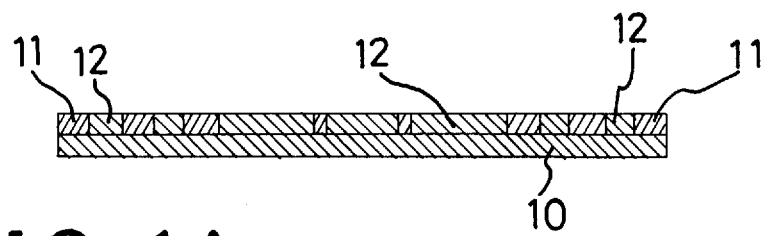
FIGS. 1A to 1H are schematic diagrams showing the processing of the BGA packaging method in accordance with the present invention.

Referring to FIG. 1A, a copper plate 10 is provided with a first dry film 11 and plated with metal, such as nickel-copper, at exposed portions not covered with the dry film 11 to form a metal layer, herein referred to a plated layer 12, which provides the necessary circuits and even the support for a chip. That is, the circuits are formed on only one side of the copper plate 10. Such a manner for forming circuits can obtain finer wires and more stable quality than a conventional etching manner.

Figure 1B:
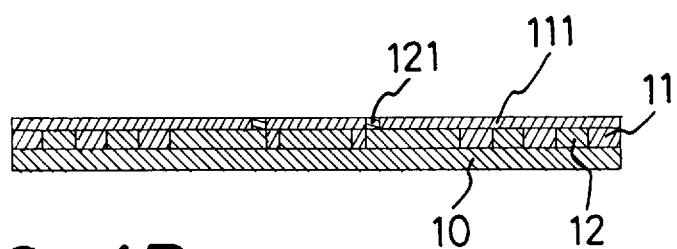

Then, a second dry film 111 is provided while the first dry film is retained. The portions not covered by the second dry film 111 are plated with nickel-gold to form metal bumps 121, as shown in FIG. 1B. As can be seen from the drawing, the bumps 121 are only located at the central area. By such a manner, the amount of gold to be used can be kept to a minimum.

Figure 1C:
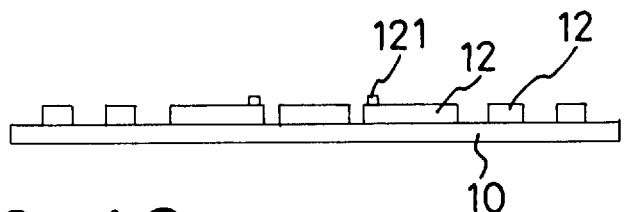

In the step shown in FIG. 1C, the first and second dry films 11, 111 are removed, leaving a copper plate 10 provided with nickel-copper plated layer 12, and nickel-gold bumps 121 on the plated layer 12.

Figure 1D:
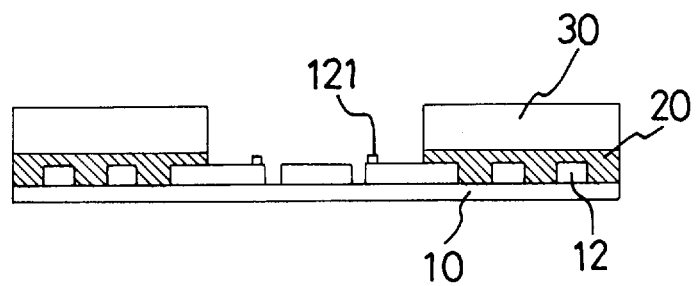

Referring to Fig. 1D, an insulating layer 20, which can be made of resin, is provided to the copper plate 10, and a back plate, which is a metal plate 30 in this embodiment, is laminated on the insulating layer 20. It should be noted that the central area remains uncovered and therefore defines a cavity. The metal plate 30, which can serve as a ground layer, is near the plated layer 12, thereby improving the electrical characteristics. The back plate can also be made of resin, and a ground layer can be added under the back plate.

Figure 1E:
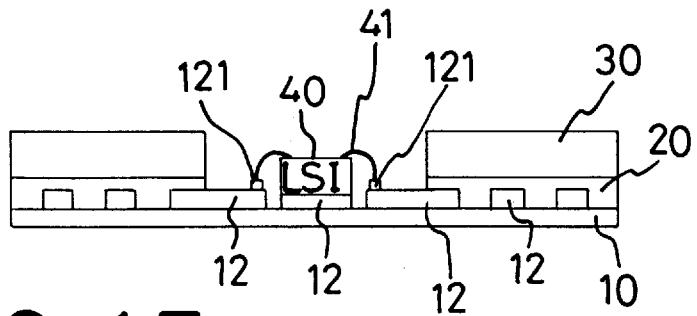

A chip 40 is attached on the plated layer 12 in the cavity, and fine gold wires 41 are bonded between the chip 40 and the bumps 121, as shown in FIG. 1E. Since the base plate (copper plate 10) is metal, heat is easily transferred during wire bonding. The chip 40 and wires 41 are then encapsulated with plastic. Referring to FIG. 1E, since the insulating layer 20 and the metal plate 30 are formed as a mold leaving the central area as a cavity, the plastic 50 can be directly applied to fill the cavity. There is no need to fabricate a specific mold and inject plastic into the mold in order to encapsulate the chip 40 and the wires 41. The height of the plastic 50, which is filled the cavity, can be flush with the level of the metal plate 30, so that the junction between the metal plate 30 and the plastic 50 is smooth and flat. By such manner, the thickness of the IC can be very small, and the shape of the IC is like a thin sheet. However, if the thickness of the metal plate 30 is increased, the packaged IC will be thicker. That is, the thickness of the IC can be changed by varying the thickness of the back plate (metal plate 30) as required.

Figure 1F:
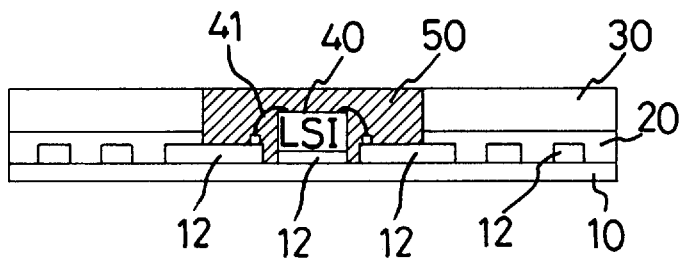
Figure 1G:
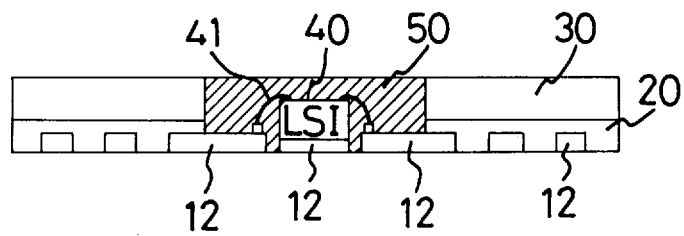

Next, the plastic 50 is hardened to be sufficient to support the chip 40, the wires 41, the plated layer 12. The copper plate 10 is then etched, and the plated layer 12 is exposed at the bottom of the semi-finished product, as shown in FIG. 1F.

Figure 1H:
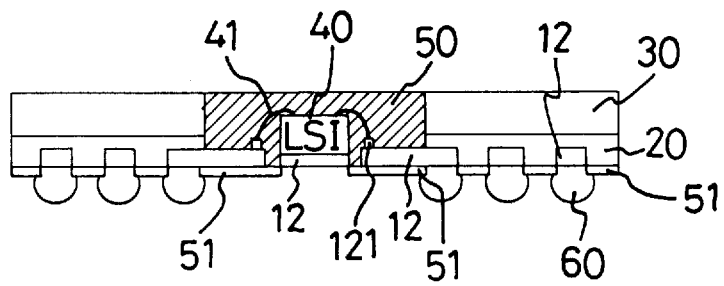
Figure 2A:
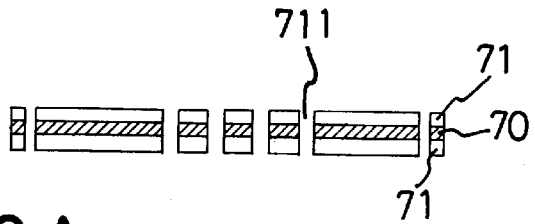
FIGS. 2A to 2H are schematic diagrams showing the processing of a conventional BGA packaging method.
Figure 2B:
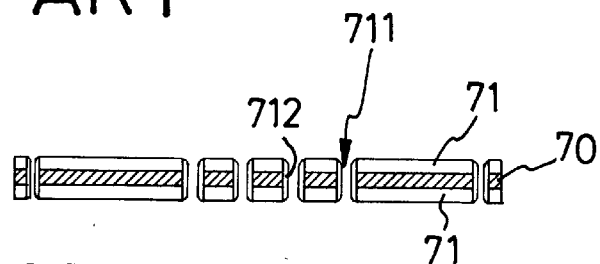
Figure 2C:
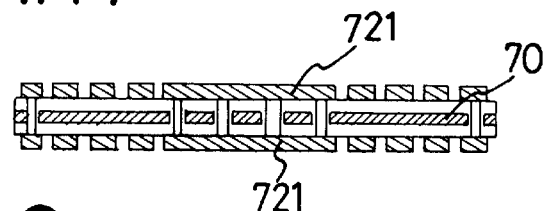
Figure 2D:
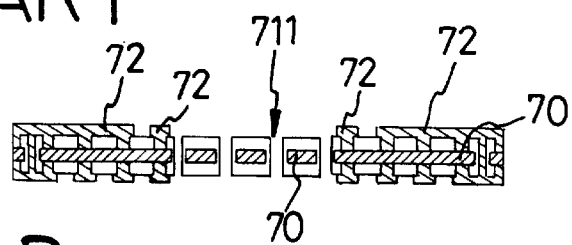
Figure 2E:
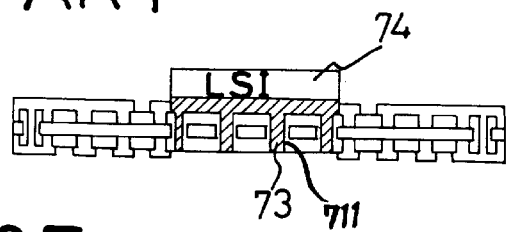
Figure 2F:
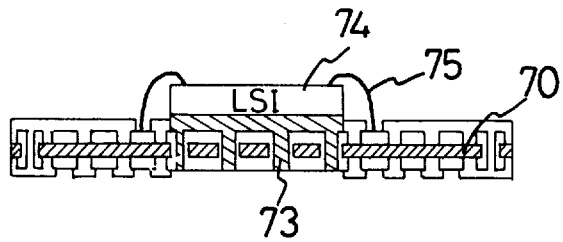
Figure 2G:
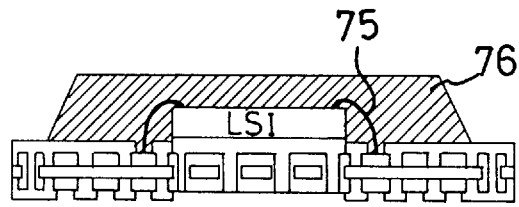
Figure 2H:
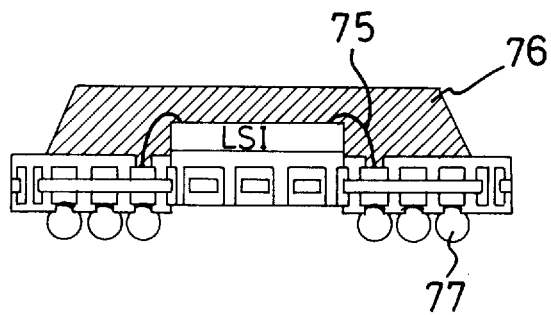

Finally, solder resist 51 is applied to the portions of the bottom not to be attached with solder balls, and solder balls 60 are soldered to the proper positions not covered with the solder resist 51, as shown in FIG. 1H. The position of the bottom of the plated layer 12 corresponding to where the chip 40 is carried can be remained uncovered so as to improve the capability for heat dissipation.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A ball grid array packaging method for an integrated circuit comprising steps of:

providing a first dry film on a copper plate;

plating a first metal onto exposed portions of the copper plate, which are not covered with the first dry film, to form a plated layer;

removing the first dry film;

laminating an insulating layer to the copper plate and then a back plate to said insulating layer and leaving a predetermined area of the copper plate as a cavity;

attaching a chip in the cavity;

bonding wires between the chip and the plated layer;

filling the cavity with plastic to encapsulate the chip and the wires;

etching the copper plate to expose the plated layer;

applying solder resist to cover the portions of the plated layer not to be attached with solder balls; and attaching said solder balls predetermined positions of the plated layer not covered with the solder resist.

2. The method as claimed in claim 1, wherein the step of plating the first metal further forms a portion of the plated layer for carrying the chip.

3. The method as claimed in claim 2, wherein in the step of applying solder resist, a bottom of the portion of the plated layer for carrying the chip is retained to be not covered with the solder resist.

4. The method as claimed in claim 1, further comprising steps of:

providing a second dry film;

selectively plating a second metal to portions not covered with the second dry film to form bumps on the plated layer.

5. The method as claimed in claim 4, wherein the wires are bonded between the chip and the bumps.

6. The method as claimed in claim 5, wherein the second metal is nickel-gold.

7. The method as claimed in claim 1, wherein the first metal is nickel-copper.

8. The method as claimed in claim 1, wherein the back plate is made of metal.

9. The method as claimed in claim 1, wherein the back plate is made of resin.

* * * * *